United States Patent [19]

Lupinski et al.

[11] Patent Number: 5,300,812
[45] Date of Patent: Apr. 5, 1994

[54] PLASTICIZED POLYETHERIMIDE ADHESIVE COMPOSITION AND USAGE

[75] Inventors: John H. Lupinski; Theresa A. Sitnik, both of Scotia; Thomas B. Gorczyca, Schenectady; Steven T. Rice, Scotia; Herbert S. Cole, Burnt Hills, all of N.Y.

[73] Assignee: General Electric Company, Schenectady, N.Y.

[21] Appl. No.: 987,849

[22] Filed: Dec. 9, 1992

[51] Int. Cl.$^5$ .............................................. H01L 23/16
[52] U.S. Cl. ................................... 257/723; 257/668; 257/702; 361/761
[58] Field of Search ............... 257/668, 700, 702, 723, 257/791, 792; 361/401

[56] References Cited

U.S. PATENT DOCUMENTS

| | | | |
|---|---|---|---|
| 4,783,695 | 11/1988 | Eckelberger et al. | 257/668 |
| 5,047,487 | 9/1991 | Camargo et al. | 525/432 |
| 5,236,988 | 8/1993 | Doyama et al. | 524/404 |

Primary Examiner—Sara W. Crane
Attorney, Agent, or Firm—Geoffrey H. Krauss; William A. Teoli

[57] ABSTRACT

A plasticized polyetherimide, such as a blend of polyetherimide and a pentaerythritol tetrabenzoate ester, has been found useful as a low temperature laminating adhesive for making high density interconnect circuit arrays.

11 Claims, 1 Drawing Sheet

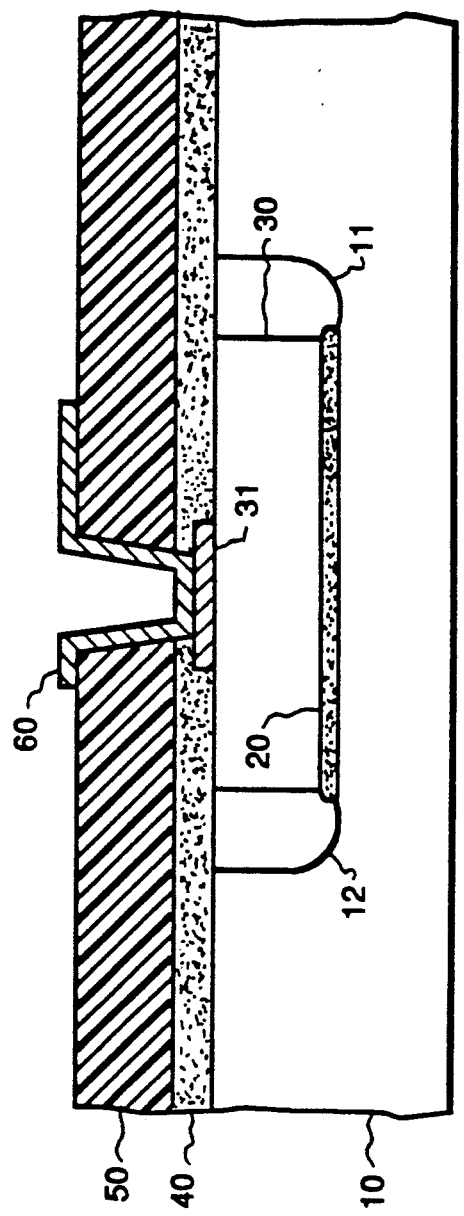

PLASTICIZED POLYETHERIMIDE ADHESIVE COMPOSITION AND USAGE

BACKGROUND OF THE INVENTION

The present invention relates to a plasticized polyetherimide composition useful as a low temperature laminating adhesive More particularly, the present invention relates to the employment of a plasticized polyetherimide as a low temperature polyetherimide laminating adhesive in a high density interconnect circuit array which can be fabricated at temperatures of 260° C. or below.

Prior to the present invention, high density interconnect structures utilized polyetherimide, such as Ultem polyetherimide, a product of GE Plastics Division, as a laminating adhesive for Kapton polyimide film, a product of E.I. duPont de Nemours Chemical Co, as shown in Eichelberger et al, U.S. Pat. No. 4,783,695. A typical procedure involved spray coating a polyetherimide solution onto a substrate having at least one integrated circuit (IC) chip followed by a bake step to effect the removal of the solvent. Kapton polyimide film was then laminated onto the substrate at 300° C. as a first dielectric overlay. An argon ion laser was then used to ablate vias to the chip bond pads and allow fabrication of patterned metal interconnection from chip to chip and to external circuitry. If desired, additional dielectric layers could be laminated using a lower temperature thermosetting adhesive. Laser fabrication of vias followed along with the deposition of additional layers of patterned metal to complete the interconnection of the multi-chip device Although such procedures allow for the fabrication of various multi-chip integrated circuit packages, temperature sensitive electronic components, such as some gallium arsenide (GaAs) IC chips, frequently cannot be exposed to temperatures up to 300° C. without impairing the electrical performance of the chips. A need exists therefore for an adhesive to provide an overlay layer on the surface of the substrate and chips which can be processed at temperatures of 260° C. or below.

In addition to satisfying lower temperature requirements, the laminating adhesive also must adhere to substrates such as alumina, aluminum nitride, silicon, silicon nitride, components such as gallium arsenide, and various metals and polymer dielectrics, such as Kapton polyimide. There is also a need for solvent compatibility, optical absorbance at laser wavelength 351 nm for laser ablation, and flow characteristics at temperatures permitting additional polyimide dielectric layer laminations. If more Kapton polyimide dielectric layers are required, the melt viscosity of the initial laminating adhesive also must be sufficiently high to avoid movement of the base lamination layer during the application of the subsequently applied polyimide dielectric layers.

SUMMARY OF THE INVENTION

The present invention is based on the discovery that a polyetherimide, such as Ultem polyetherimide of GE Plastics Division, can be plasticized with certain plasticizers, such as pentaerythritol tetrabenzoate ester (Benzoflex S-552 of the Velsicol Chemical Co) or triphenylphosphate. It has been found that clear films can be made of the plasticized polyetherimide by casting a blend of the polyetherimide and plasticizer from certain organic solvents, such as acetophenone or anisole. The combination of the polyetherimide with two plasticizers, such as in a mixture of polyetherimide, pentaerythritol tetrabenzoate and triphenylphosphate in a ratio of 4/1/1, also has been found effective. A melt viscosity suitable for processing is achieved at temperatures between 200° C. to 260° C.

STATEMENT OF THE INVENTION

There is provided by the present invention, a plasticized polyetherimide adhesive composition having a melt viscosity capable of providing substantially void free adhesive bonding at temperatures in the range of about 200° to 260° C. between overlay dielectric layer and substrate having at least one IC chip attached thereon, which plasticized polyetherimide composition comprises by weight, (A) 100 parts of a polyetherimide, and
(B) 5 to 25 parts of a plasticizer.

There is further provided by the present invention, a high density interconnect circuit array comprising, (a) a substrate,
(b) at least one integrated circuit chip with at least one interconnection pad disposed on the substrate, and
(c) a laminate layer overlying and bridging the integrated circuit chip, where the laminate layer of (c) has a plurality of via openings, where at least one of the via openings is aligned with at least one of the interconnection pads of (b) and a pattern of interconnection conductors disposed on top of the laminate layer so as to extend between some of the openings to provide electrical connections between at least one of the interconnection pads through the openings, which laminate layer of (c) comprises a dielectric overlay layer and an adhesive layer in direct contact with the IC chip, which adhesive layer comprises a plasticized polyetherimide having a melt viscosity sufficiently low to provide void free adhesive bonding at temperatures in the range of between 200° C. to 260° C. between the dielectric overlay layer and substrate having at least one IC chip disposed thereon.

Polyetherimides which can be utilized in the practice of the present invention to make the plasticized polyetherimide adhesive composition comprise the reaction product of substantially equal molar amounts of an aromatic bis(ether anhydride) of the formula,

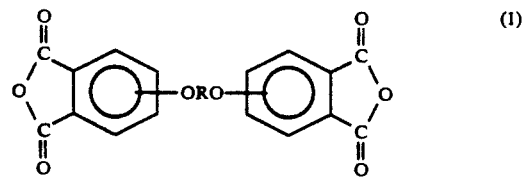

and an aryldiamine of the formula, $$NH_2R_1NH_2, \qquad (2)$$

where R is a member selected from the class consisting of divalent organic radicals of the formulas,

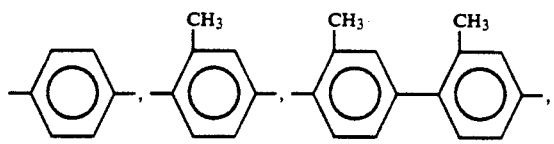

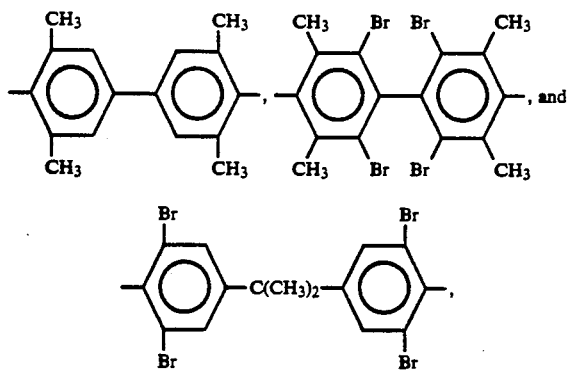

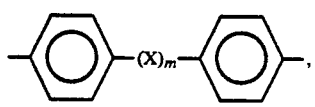

and divalent organic radicals included within the formula,

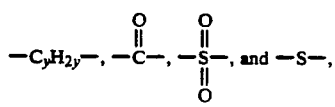

where X is a member selected from the class consisting of divalent radicals of the formulas, $$-C_yH_{2y}-, -\overset{O}{\underset{\parallel}{C}}-, -\overset{O}{\underset{\underset{O}{\parallel}}{\overset{\parallel}{S}}}-, \text{ and } -S-,$$

m is 0 or 1, y is an integer equal to 1 to 5, and the bonds of the —O—R—O— radical of formula 1 are equally situated on the phthalic anhydride end groups in the ,3,3'-positions, 3,4'-positions or the ,4,4'-positions.

Preferably, the aromatic (ether anhydride) of formula (1), such as 2,2-bis[4-2,3-dicarboxyphenoxy)phenyl]propane dianhydride, and 2,2-bis[4(3,4-dicarboxyphenoxy)-phenyl]propane dianhydride.

R¹ in formula (2) is a divalent organic radical having from 6–20 carbon atoms and halogenated derivatives thereof, alkylene radicals and cycloalkylene radicals having from 2–20 carbon atoms, $C_{(2-8)}$ alkylene terminated polydiorganosiloxane, and divalent radicals included within the formula,

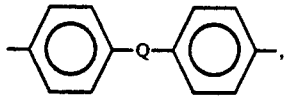

where Q is a member selected from the class consisting of

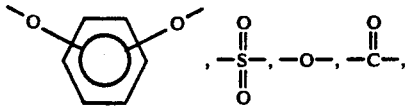

—S—, and —$C_xH_{2x}$—, where x is an integer equal to 1 to 5.

Among the aryl diamines of formula (2), which also include mixtures thereof, there are, for example,
m-phenylenediamine;
p-phenylenediamine;
4,4'-diaminodiphenylpropane;
4,4'-diaminodiphenylmethane;
benzidine;
4,4'-diaminodiphenyl sulfide;
4,4'-diaminodiphenyl sulfone;
4,4'-diaminodiphenyl ether;
1,5-diaminonaphthalene;
3,3'-dimethylbenzidine;
3,3'-dimethoxybenzidine;
2,4-diaminotoluene;
2,6-diaminotoluene;
2,4-bis(β-amino-t-butyl)toluene;
bis(p-β-methyl-o-aminopentyl)benzene;
1,3-diamino-4-isopropylbenzene;
m-xylylenediamine;
p-xylylenediamine;
2,4-diaminotoluene; and
2,6-diaminotoluene.

Plasticizers which can be used in combination with the above-described polyetherimide are for example, pentaerythritol tetrabenzoate, triphenylphosphate and bisimides such as, bisphenol A dianhydride bis(N-phenylimide),

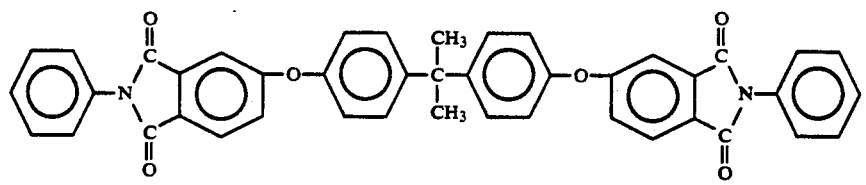

bisphenol A dianhydride bis(N-methylimide),

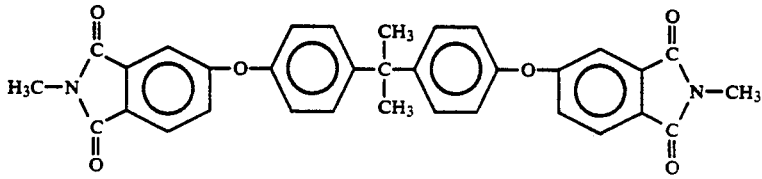

and bisphenol A dianhydride bis(N-butylimide),

-continued

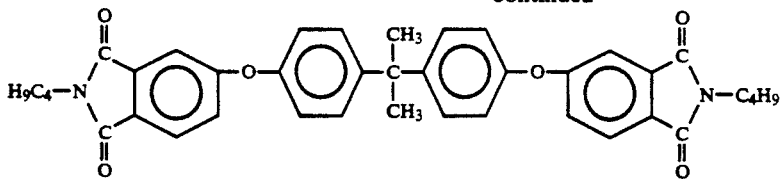

and bisphenol A dianhydride bis(N-pyridylimide),

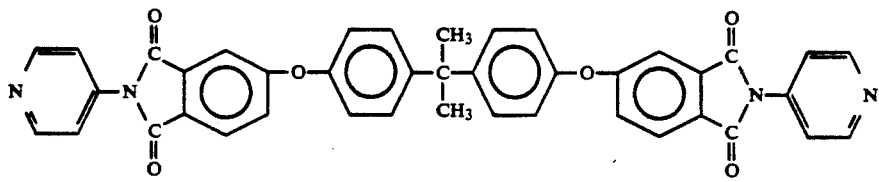

The plasticized polyetherimide can be made by solvent blending or melt blending procedures. A typical solvent blending procedure would involve the use of predetermined quantities of polyetherimide and plasticizer which are placed in a container with the appropriate amount of an organic solvent to dissolve the polymer and plasticizer and provide a clear homogeneous polymer solution. This can be accomplished by heating the mixture to about 80° C. with gentle agitation. Suitable organic solvents are anisole, acetophenone, N-methylpyrrolidone, methylene chloride, chloroform, dimethylacetamide and p-methylacetophenone. The solution of plasticized polyetherimide can then be applied as an adhesive coating to the surface of a dielectric film, such as Kapton polyimide. An alternative to solution blending is melt blending. A polyetherimide, such as Ultem polyetherimide, is heated above its melt flow temperature and an appropriate amount of plasticizer is added to the melt. In this manner, it is possible to extrude films for subsequent use as laminating adhesives.

As previously discussed, the plasticized polyetherimide composition can be used as an adhesive in the fabrication of multi-chip integrated circuit arrays. The preferred method for assembling the integrated circuit array is shown by Eichelberger et al, U.S. Pat. No. 4,783,695 which is incorporated herein by reference. Accordingly, a plurality of circuit chips is disposed on a substrate. The plasticized polyetherimide is applied onto the chips and the substrate in order that the resulting polyimide overlay layer bridges the chips. Application of the plasticized polyetherimide can be achieved by initially applying a solution of the plasticized polyetherimide by a spinning technique, or it can be heat pressed on in the form of a film or laminated on as a composite layer with a polyimide, such as a Kapton polyimide. Lamination may be achieved using conventional laminators employing a silicone rubber press pad to accommodate the surface topography of the circuitry. Alternatively, laminations can be achieved using a vacuum-pressure laminator. Lamination is conducted at the temperature at which the plasticized polyetherimide melts, preferably in the range between 200° C. to 260° C.

Via holes formed in the array resulting from the above processing steps can be used to provide contact to power, ground, or signal, or packaging pins if desired. Preferably an argon ion laser operating at 351 nm is used to drill vias through the Kapton polyimide and adhesive layer overlying the bond pads on the chips and substrate. A laser is sequentially focused at each pad site to ablate polymeric material. The polymer overlay film absorbs incident radiation which locally heats the film resulting in rapid thermal decomposition and evaporation. Alternately, via holes can be formed by depositing a thin layer of metal, such as, for example, a 1000Å thick layer of titanium or chromium on the laminate surface. Openings in the metal are then patterned using conventional photolithography methods. The perforated metallic layer is then exposed to a laser beam to form through holes by ablation of the polymer film. An excimer laser or CW laser can be used in this process as well as reactive ion etching.

BRIEF DESCRIPTION OF THE DRAWING

In order to further understand the subject matter of the present invention, reference is made to the drawing. The drawing shows in cross-section, a simplified view of a high density interconnect structure comprising a substrate to which there is affixed an integrated circuit chip having an interconnection pad, a dielectric overlay layer and a metal layer.

More particularly, there is shown in cross-section, a substrate, such as alumina, at 10 and an IC chip at 30 which is bonded to the base of a well or recess in the substrate 10 by an epoxy chip adhesive at 20, such as Ablebond 84-1-LMN-T of Able Stik Lab., Gardena, Calif. The well walls of substrate 10 are shown at 11 and 12. Overlying the IC chip and substrate, is a plasticized polyetherimide adhesive layer at 40 which bonds a dielectric overlay layer 50, such as Kapton polyetherimide, to the substrate and IC chip. A metal layer, for example, Ti/Cu/Ti, is shown at 60 having a via opening to a metal bond pad at 31 on the IC chip. Although a single IC chip, interconnection pad, dielectric overlay layer and metal layer are shown in the drawing, the high density interconnect circuit arrays included within the scope of the present invention also can have one or more chips, and additional laminate layers above the laminate layers in direct contact with the IC chips and substrate. These additional laminated dielectric overlay layers can consist of a Kapton polyimide dielectric layer and an adhesive layer, such as a siloxane polyetherimide. A plurality of via openings to provide additional interconnection pads on IC chips and metal pads on the substrate are also within the scope of the present invention to provide more complex structures.

In order that those skilled in the art will be better able to practice the present invention, the following examples are given by way of illustration and not by way of limitation. All parts are by weight.

EXAMPLE 1

A solution was prepared of 2.5 g of Ultem 1010 polyetherimide of the Plastics Division of GE Co.,0.25 g of Benzoflex S-552, a pentaerythritol tetrabenzoate ester of the Velsicol Chemical Co, 7.5 g of anisole and 0.8 g of toluene. The solution was then heated for several hours with stirring at 80° C. The solution was spin coated into a 1 mil thick metal frame supported Kapton polyimide film of the E.I. Dupont de Nemours Co. The resulting coated polyimide film was baked to remove the solvent. The bake cycle was 30 min at 110° C., 30 min at 150° C. and 30 min at 175° C., followed by a final bake-out of 1 hr at 250° C. There was obtained a composite structure having ½ mil thick plasticized polyetherimide on a 1 mil thick Kapton polyimide film.

The polyimide/plasticized polyetherimide composite was then laminated to an alumina substrate having IC chips bonded on the alumina substrate within chip wells. The alumina substrate was placed in a vacuum chamber with the polyimide/polyetherimide composite film above with the plasticized polyetherimide side down overlying the chips and substrate. The chamber was evacuated and heated to 260° C. A pressure of 55 psi was applied to the top side of the polyimide/plasticized polyetherimide composite and the chamber held at this temperature for hr. After cooling under pressure to a temperature below 150° C., the laminated part was removed. A clean, void-free lamination resulted. A pull strength test on the laminated part resulted in the Kapton polyimide layer ripping at 7 lbs, whereas a lb pull strength was obtained with a laminate having a similar thickness of Kapton polyimide and polyetherimide free of plasticizer.

EXAMPLE 2

Polymer solutions containing 0, 10, 20, 30 and 40% by weight Benzoflex S-552 in Ultem 1010 polyetherimide were prepared by dissolving the polymer and plasticizer in an appropriate amount of anisole. The polymer solutions were then respectively spun onto Kapton polyimide films supported on metal frames. The resulting coated polyimide films were then spin coated and baked to remove solvent. The bake cycle was identical to that described in example 1. The resulting composite structures contained ½ mil adhesives on 1 mil thick Kapton polyimide film.

The resulting polyimide/plasticized polyetherimid composite layers were then laminated as described in example 1. The laminations were evaluated for optical quality. Excellent void free laminations were obtained. The unplasticized polyetherimide composite, however, had numerous air pockets due to poor flow properties during lamination.

All samples containing various amounts of plasticizer were further processed to fabricate workable multi-chip interconnect structures. Vias were drilled to bonding pads on the chip followed by patterned metallization. This was accomplished by sputtering 1,000Å of a top titanium layer. The metal interconnect structure was patterned using standard photoresist processing. Two additional dielectric layers were fabricated using a siloxane-polyimide epoxy adhesive to laminate Kapton polyimide at a processing temperature of 185° C. A patterned layer of titanium/copper/titanium was used between each dielectric layer to complete the interconnect structure. After fabrication, the modules were tested for electric continuity and the results summarized in the following table.

| PERFORMANCE SUMMARY OF PLASTICIZED POLYETHERIMIDE LAMINATIONS (260° C.) | | | |
| --- | --- | --- | --- |
| wt. % Benzoflex S-552 in Ultem 1010 | Lamination Quality | Electrical test | Remarks |
| 0 | poor (air bubbles) | — | Poor adhesive flow |
| 10 | excellent, clear, void free | 100% functional | |
| 20 | excellent, clear void free | 100% functional | |
| 30 | excellent, clear void free | some opens | flow of plasticized polyetherimide during upper layer lamination at 185° C. |
| 40 | excellent, clear void free | some opens | flow of plasticized polyetherimide during upper layer lamination at 185° C. |

A polymer solution was prepared by mixing 9 g of Ultem 1000 polyetherimide with 1 g of bisphenol A dianhydride bis(N-methylimide) in 40 g of anisole and heating for several hrs. at 80° C. The resulting solution was spin coated and baked to form a ½ mil adhesive film on Kapton polyimide. The resulting polyimide/plasticized polyetherimide composite was then laminated to an alumina substrate containing IC chips which had been placed in chip wells on the alumina substrate. The lamination was carried out as described in example 1 resulting in a void free lamination. A 7 lb pull strength test was performed before the Kapton polyimide showed signs of tearing apart.

EXAMPLE 4

A plasticized polyetherimide layer (½ mil thick) was prepared by blending 5% by weight of bisphenol A dianhydride bis(N-phenylimide) with Ultem 1010 polyetherimide. The ingredients were dissolved in acetophenone to provide a clear solution which was used to form a solvent free layer. A composite Kapton polyimide/plasticized polyetherimide film was prepared which was laminated onto an alumina substrate at 250° C. using a pressure of 45 psi applied to the top side. A pull strength test showed a value of 6.4 lbs. whereas a part laminated with unplasticized Ultem 1010 polyetherimide had a pull strength of 1.6 lbs.

EXAMPLE 5

A polyimide/plasticized polyetherimide composite was prepared as described in example 1, except that the adhesive was applied to Kapton polyimide E film. The composite was then laminated to an aluminum nitride substrate containing IC chips composed of silicon and gallium arsenide. Lamination was accomplished by placing the composite and the substrate in a vacuum chamber having the plasticized polyetherimide side in contact with the chips and substrate. The chamber was evacuated. The array was heated to 250° C. with a pressure of 10 psi applied to the top side. These conditions were maintained for 20 min. After cooling under pressure to a temperature below 150° C., the laminated part was removed. A clean, void free lamination resulted. A similar lamination was carried out with a plasticized polyetherimide containing 5% by weight Benzoflex S-552 in Ultem 1010 polyetherimide. Additionally, plasticized polyetherimide blends containing 10% Benzoflex S-552 in Ultem 1010 were laminated as described except that the lamination temperatures were lowered to 240° and 230° C. respectively. Excellent laminations were obtained under these conditions.

Although the above examples are directed to only a few of the very many polyetherimides and plasticizers which can be used in the practice of the invention, other plasticizers can be used in conjunction with additional polyetherimides as shown in the description preceding these examples. One such series of plasticizers are commercially available from Velsicol Chemical, namely aromatic aliphatic ester derivatives of pentaerythritol. Some of the key requirements of the plasticizers are compatibility with polyetherimides and solvents and thermal stability in excess of 260° C. Overlay polyimide films other than Kapton H polyimide or Kapton E polyimide, such as Apical film of Allied Signal Corporation, Upilex film and and a polyquinoline PQ-100 film from Maxdem Corp, also can be used.

What is claimed is:

1. A plasticized polyetherimide adhesive composition having a melt viscosity capable of providing substantially void free adhesive bonding at temperatures in the range of about 200° to 260° C. between overlay dielectric layer and substrate having at least one IC chip attached thereon, which plasticized polyetherimide composition comprises by weight,
   (A) 100 parts of a polyetherimide, and
   (B) 5 to 25 parts of a plasticizer.

2. A plasticized polyetherimide adhesive in accordance with claim 1, where the plasticizer is a bisphenol A dianhydride bis(alkyl or aryl bismide).

3. A plasticized polyetherimide adhesive in accordance with claim 1, where the plasticizer is pentaerythritol tetrabenzoate.

4. A plasticized polyetherimide adhesive in accordance with claim 1, where the plasticizer is triphenylphosphate.

5. A plasticized polyetherimide adhesive in accordance with claim 2, where the plasticizer is bisphenol A dianhydride bis(N-phenylimide).

6. A plasticized polyetherimide adhesive in accordance with claim 2, where the plasticizer is bisphenol A dianhydride bis(N-methylimide)

7. A plasticized polyetherimide adhesive in accordance with claim 2, where the plasticizer is bisphenol A dianhydride bis(N-butylimide).

8. A plasticized polyetherimide adhesive in accordance with claim 2, where the plasticizer is bisphenol A dianhydride bis(N-pyridylimide).

9. A high density interconnect circuit array comprising,
   (a) a substrate,
   (b) at least one integrated circuit chip with at least one interconnection pad disposed on the substrate, and
   (c) a laminate layer overlying and bridging the integrated circuit chip, where the laminate layer of (c) has a plurality of via openings, where at least one of the via openings is aligned with at least one of the interconnection pads of (b) and a pattern of interconnection conductors disposed on top of the laminate layer so as to extend between some of the openings to provide electrical connections between at least one of the interconnection pads through the openings, which laminate layer of (c) comprises a dielectric overlay layer and an adhesive layer in direct contact with the integrated chip, which adhesive layer comprises a plasticized polyetherimide having a melt viscosity sufficiently low to provide void free adhesive bonding at temperatures in the range of between 200° C. to 260° C. between the dielectric overlay layer and substrate having at least integrated circuit chip disposed thereon.

10. A high density interconnect circuit array in accordance with claim 9, having at least one additional laminate layer above the laminate layer of (c) comprising a dielectric layer and an adhesive layer.

11. A high density interconnect circuit array in accordance with claim 10, where the dielectric layer is a polyimide and the adhesive layer is a siloxane polyimide.

* * * * *